United States Patent
Honda et al.

(10) Patent No.: US 7,868,773 B2
(45) Date of Patent: Jan. 11, 2011

(54) SWITCHED MODE POWER CONVERTER WITH OVER TEMPERATURE DETECTION

(75) Inventors: Jun Honda, El Segundo, CA (US); Mathias Duppils, El Seguno, CA (US)

(73) Assignee: International Rectifier Corporation, El Segundo, CA (US)

( * ) Notice: Subject to any disclaimer, the term of this patent is extended or adjusted under 35 U.S.C. 154(b) by 315 days.

(21) Appl. No.: 12/209,530

(22) Filed: Sep. 12, 2008

(65) Prior Publication Data

US 2009/0066523 A1    Mar. 12, 2009

Related U.S. Application Data

(60) Provisional application No. 60/971,757, filed on Sep. 12, 2007.

(51) Int. Cl.
*G08B 17/06* (2006.01)
*G08B 21/00* (2006.01)

(52) U.S. Cl. .................. 340/593; 340/635; 340/636.18

(58) Field of Classification Search .............. 340/593, 340/594, 635, 636.14, 636.18, 644, 661; 361/103, 101, 93.1; 374/178, 170
See application file for complete search history.

(56) References Cited

U.S. PATENT DOCUMENTS

| | | | |
|---|---|---|---|
| 3,996,481 A | 12/1976 | Chu et al. | |
| 5,122,137 A | 6/1992 | Lennox | |
| 5,805,403 A * | 9/1998 | Chemla | 361/103 |
| 7,255,476 B2 | 8/2007 | Franch et al. | |
| 7,304,828 B1 * | 12/2007 | Shvartsman | 361/93.1 |
| 7,782,585 B2 * | 8/2010 | Doi et al. | 361/103 |

OTHER PUBLICATIONS

International Search Report dated Dec. 1, 2008 issued in corresponding International Application No. PCT/US08/10682.

* cited by examiner

*Primary Examiner*—Van T. Trieu
(74) *Attorney, Agent, or Firm*—Farjami & Farjami LLP

(57) ABSTRACT

An over temperature detector circuit for use in a switching converter including one or more power switches in accordance with an embodiment of the present application includes a silent sense generator connected to at least one power switch and operable to detect a noise level of the switch and to provide a generator output signal indicative of absence of switching noise and a comparator operable to compare a temperature sensor signal from a temperature sensor with a reference voltage to provide an alarm signal indicating an over temperature condition when the temperature sensor signal exceeds the reference voltage, wherein the alarm signal does not indicate an over temperature condition when the generator output signal does not indicate absence of switching noise.

15 Claims, 10 Drawing Sheets

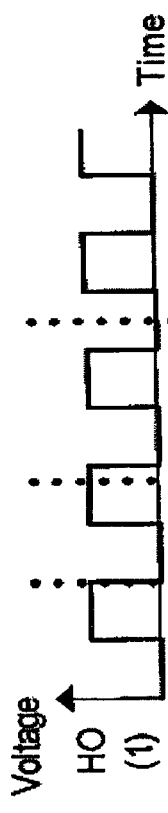
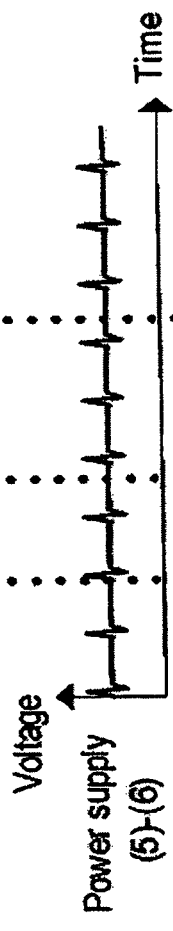
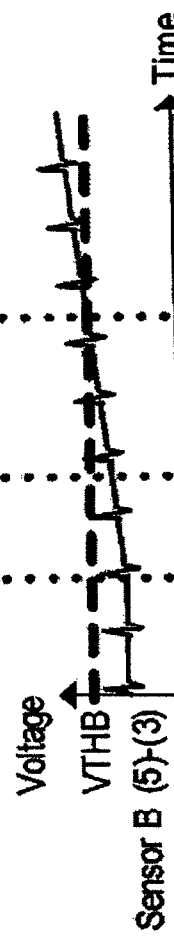
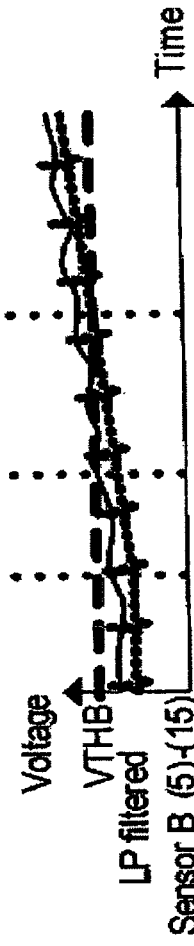
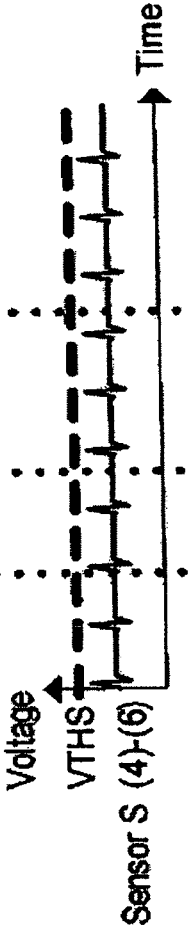
Fig. 5A
Fig. 5B
Fig. 5C
Fig. 5D
Fig. 5E

SWITCHED MODE POWER CONVERTER WITH OVER TEMPERATURE DETECTION

The present application claims benefit of and priority to U.S. Provisional Patent Application Ser. No. 60/971,757 filed Sep. 12, 2007 entitled OVER TEMPERATURE DETECTION FOR UNIDIRECTIONAL NOISE, the entire contents of which are hereby incorporated by reference herein.

BACKGROUND OF THE INVENTION

The present application relates to a switched mode power supply with improved over temperature detection.

In order to protect power switching devices in switching power converters from overheating, temperature sensors are provided as close as possible to the power switches. As power devices have been reduced in size, they are more commonly mounted directly on the printed circuit board (PCB) surface. Thus, the temperature sensors are typically provided on the electrodes of the switch, since the thermal resistance in the copper traces is better than that of the PCB bulk material. However, when such sensors are attached to the electrodes, a large common mode noise results in the terminals of the temperature sensor as a result of the switching of the switches.

The block diagram of FIG. 1 illustrates one conventional approach to providing over temperature sensing for a switched mode power converter. FIG. 1 illustrates a temperature sensor 10, a noise generator 12 and the prior art temperature detector circuit 14 which includes a low pass filter 14a and a comparator 14b. The noise generator 12 triggers transient noise for each noise triggering event, typically based on switching activity of the power switches. The temperature sensor 10 produces a sensor signal which is disturbed by the switching noise and passed to the over temperature detector circuit 14. An over temperature alarm signal is provided as the output of the comparator 14b when the sensor output indicates an abnormally high temperature. In FIG. 1, the temperature sensor signal includes noise generated by the switching of the switches which may lead to an unreliable alarm signal from the temperature detector 14.

Thus, it would be advantageous to provide a temperature detector that avoids these problems.

SUMMARY OF THE INVENTION

It is an object of the present invention to provide an over temperature detector circuit that minimizes the effect of noise.

An over temperature detector circuit for use in a switching converter including one or more power switches in accordance with an embodiment of the present application includes a silent sense generator connected to at least one power switch and operable to detect a noise level of the switch and to provide a generator output signal indicative of absence of switching noise and a comparator operable to compare a temperature sensor signal from a temperature sensor with a reference voltage to provide an alarm signal indicating an over temperature condition when the temperature sensor signal exceeds the reference voltage, wherein the alarm signal does not indicate an over temperature condition when the generator output signal does not indicate absence of switching noise.

A switching power converter with over temperature detection in accordance with an embodiment of the present application includes a first power switch, a second power switch connected in series with the first power switch such that a desired voltage is provided at an output node between the first and second power switches, a first temperature sensor connected to the first power switch, a second temperature sensor connected to the second power switch and an over temperature detector circuit connected to the first temperature sensor, the second temperature sensor and a control terminal of at least one of the first and second power switches, the over temperature detector circuit operable to provide an over temperature alarm signal indicating an over temperature condition when a temperature of the first power switch or the second power switch exceeds predetermined threshold values, wherein the alarm signal does not indicate an over temperature condition when a noise level on one of the first and second power switches is high.

An over temperature detector circuit for use in a switching converter including one or more power switches in accordance with an embodiment of the present application includes a silent signal generator connected to at least one power switch and operable to detect a noise level of the switch and to provide a generator output signal indicative of absence of switching noise and a comparator operable to compare a temperature sensor signal from a temperature sensor connected to the power switch with a reference voltage to provide an alarm signal indicating an over temperature condition when the temperature sensor signal exceeds the reference voltage, wherein the alarm signal does not indicate an over temperature condition when the generator output signal does not indicate absence of switching noise.

Other features and advantages of the present invention will become apparent from the following description of the invention which refers to the accompanying drawings.

BRIEF DESCRIPTION OF THE DRAWING(S)

FIG. 5A-FIG. 5H are graphs illustrating typical waveforms of the circuit of FIG. 4.

DETAILED DESCRIPTION OF PREFERRED EMBODIMENTS

Figure 1:
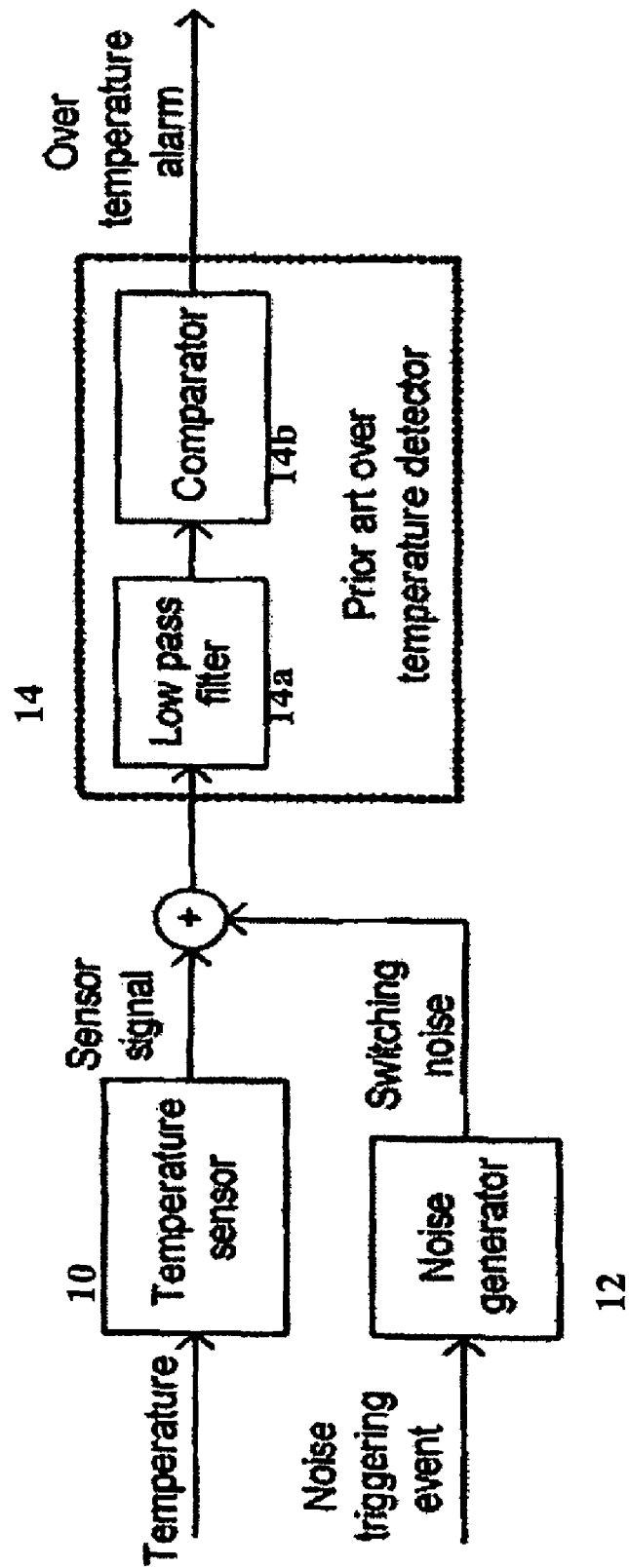
FIG. 1 is a block diagram illustrating a convention temperature detector circuit for use with a switching power converter.
Figure 2:
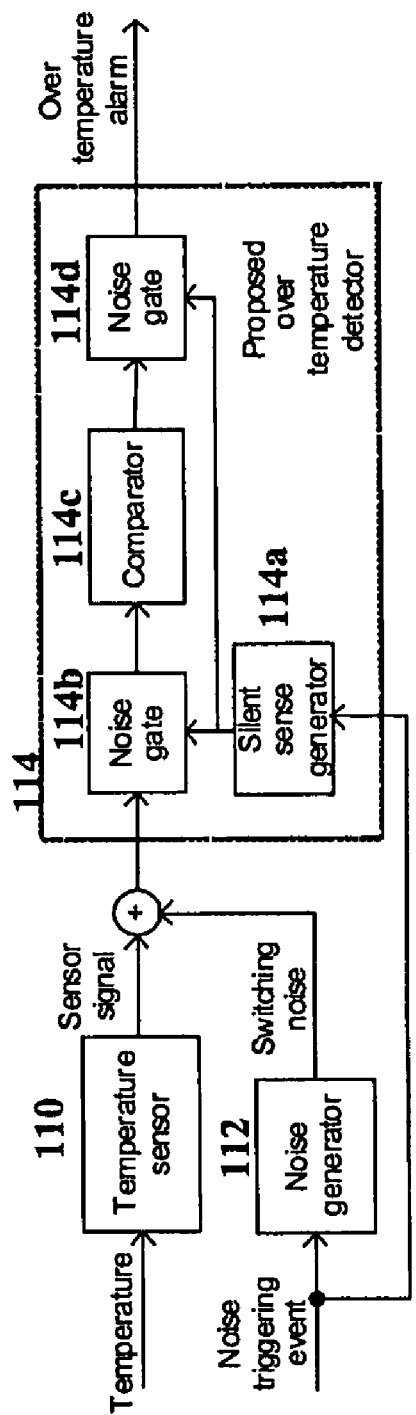
FIG. 2 is a block diagram illustrating a temperature detector circuit in accordance with an embodiment of the present application.

A temperature detector circuit 114 in accordance with an embodiment of the present application is illustrated in FIG. 2, for example. In the temperature detector circuit 114, a sensor signal from the temperature sensor 110 is gated when switching noise is present. This avoids the problem of producing a DC offset error based on the noise.

The temperature sensor 110 provides an indication of the circuit temperature and may be connected to the electrode of a switch, as described above. When noise is generated by the noise generator, typically due to switching activity of the power switch, the output of the sensor 110 will include the generated noise.

The temperature detector circuit 114 receives as an input, the output of the temperature sensor 110. The detector circuit 114 includes a silent sense generator 114a which is used to detect a noise triggering event, such as switching of the power switches. The generator 114a monitors the switching activity or the noise triggering signals and activates a silent sense signal to pass the signal through the gates 114b, 114d when active switching noise is predicted to be low. That is, the output of the generator 114a is active, or high, when the noise level is low, while the output is inactive, or low, at other times. The noise gates 114b, 114d are connected to receive the sensor signal, and the comparator output, respectively, and pass the sensor signal and comparator output, respectively, when the silent sense signal is active, or high, that is, when the noise level is low. At all other times, the noise gates 114b, 114d block the sensor signal and/or comparator output such that no over temperature alarm can be triggered. While FIG. 2 illustrates two noise gates 114b positioned between the sensor 110 and the comparator 114c and the gate 114d positioned at the output of the comparator, it is noted that it is not necessary to use both noise gates. A single noise gate may be used instead and may be positioned either between the sensor 110 and the comparator 114c, or after the comparator, as desired.

That is, in the detector circuit 114, the sensor 110 output signal and/or the comparator 114c output signal are blocked when switching noise is present. This will improve the detector sensitivity and will reduce instances of false alarm where the noise in the sensor signal incorrectly triggers the alarm signal. While the noise gate is illustrated as positioned between the sensor 110 and the comparator 114c, it is noted that these devices may switch position such that the output of the comparator, which serves and the alarm signal is gated based on the generator output. In either case, the alarm signal will not indicate an over temperature condition, that is go high, unless the noise level detected by the generator 114a is low, and thus has little affect on the output of the sensor 110.

Figure 3:
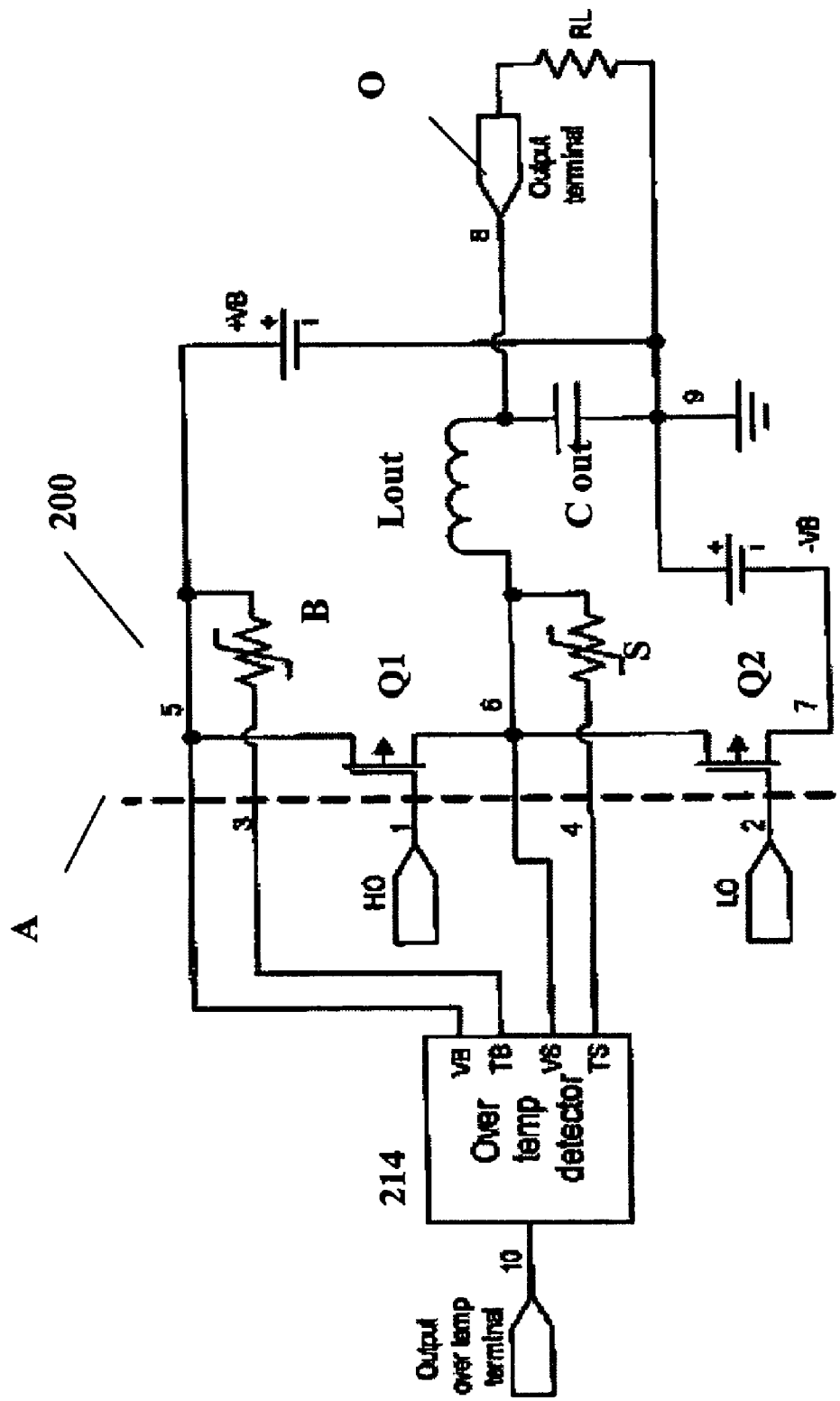
FIG. 3 illustrates a conventional temperature detector circuit connected to an exemplary power switching converter.

FIG. 3 illustrates an example of a prior art temperature detector circuit 214 connected to a switched mode power converter 200 with dual temperature sensors B, S. The converter 200 includes switches Q1, Q2 which are controlled at the control terminals HO and LO. An inductor Lout is connected to the common node positioned between the switches Q1, Q2 along with an output capacitor Cout. The output terminal O is connected to a load represented by the resistance RL. Two separate power supplies +VB and −VB are connected to the positive and negative rails, respectively. The circuits to the left of the line A are preferably embodied as integrated circuits while those on the right side of line A are PCB level circuits. The temperature sensors B, S are connected between terminals VB and TB and terminals VS and TS, respectively, of the detector circuit 214.

Figure 4:
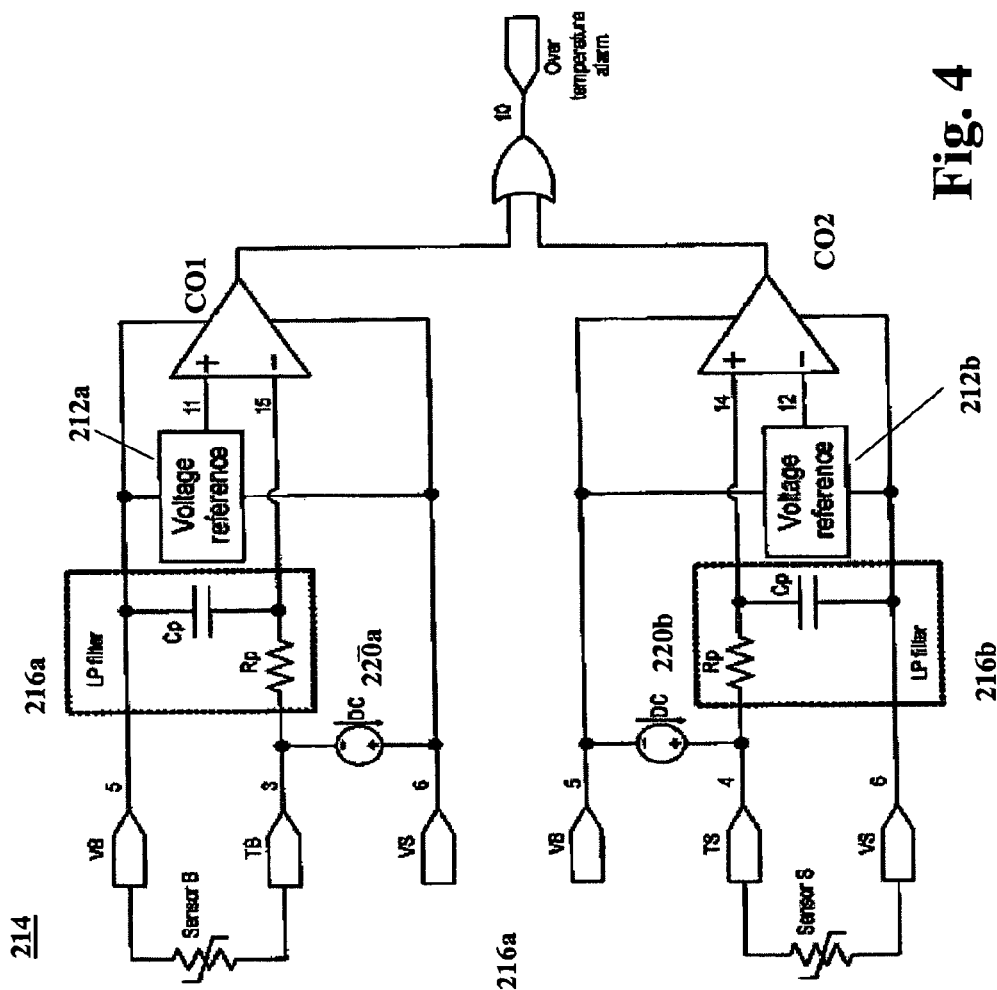
FIG. 4 illustrates a more detailed diagram of the conventional detector circuit of FIG. 3.

The detector circuit 214 of FIG. 3 is illustrated in further detail in FIG. 4. As noted above, this circuit is preferably embodied as an integrated circuit and includes power supply terminals VB and VS, sensor terminals TB and TS and output alarm terminal 10. For each temperature sensor B, S a current source 220a, 220b, a voltage reference 212a, 212b and an analog comparator CO1, CO2 whose output is combined via an OR gate to the over temperature output terminal 10. The current sources 220a, 220b drive the current from the node TB to VS and from the node VB to TS, respectively. The voltage reference circuits 212a, 212b generate the reference voltages VTHB and VTHS which are referenced to VB and VS respectively. Resistor Rp and capacitor Cp provide a pole frequency for the LC filters 216a, 216b between the sensor nodes and the comparator input nodes.

The temperature sensors B, S are preferably thermistors whose resistance is a positive or negative function of temperature. The sensor voltage is provided by forcing a reference through the temperature sensor. The sensor voltage is low pass filtered and passed to the comparator(s) CO1, CO2 and compared to the reference voltages VTHB and VTHS. An over temperature condition is reported when the filtered sensor voltage exceeds a reference voltage. The alarm signal at terminal 10 goes high at this point.

Figures 5F, 5G, 5H:
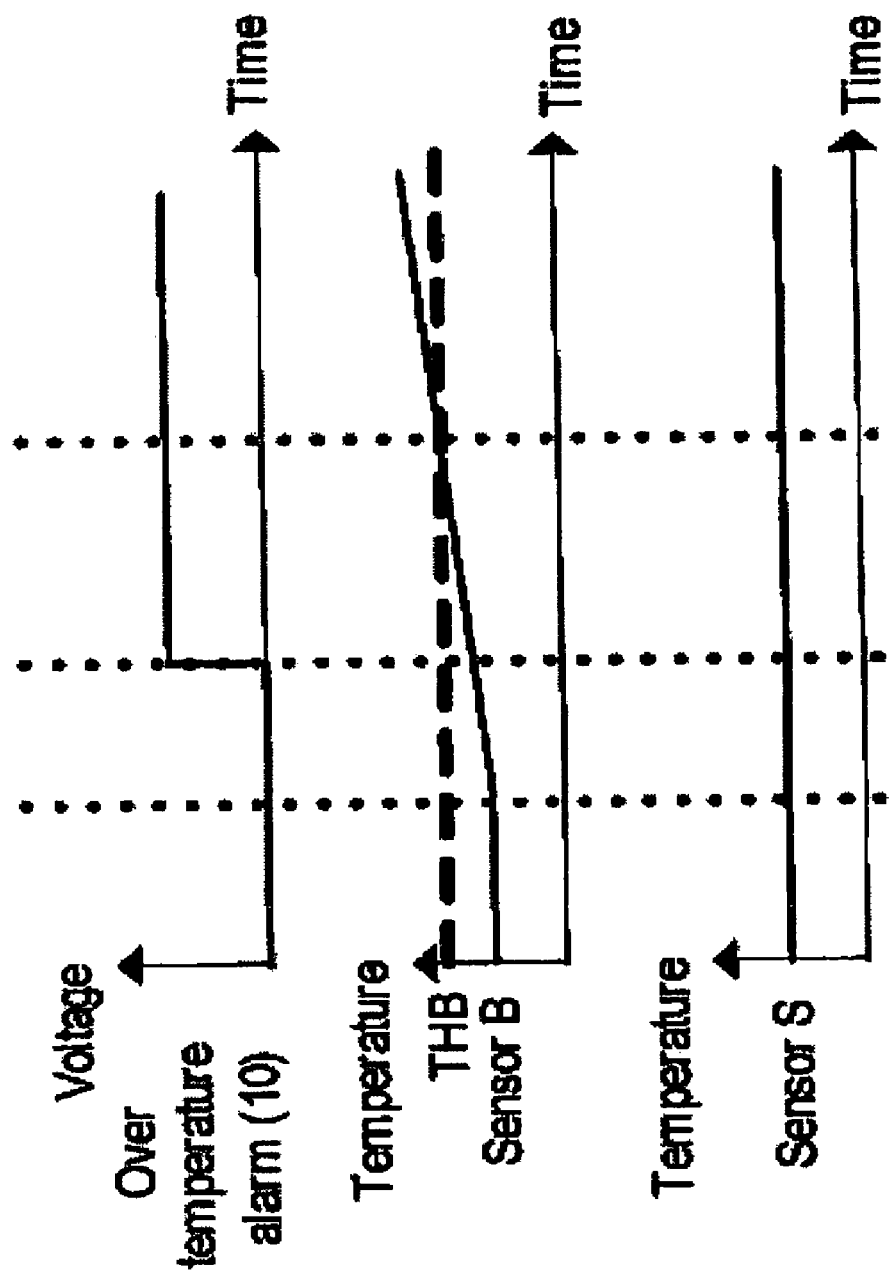

FIG. 5 illustrates typical waveforms for the circuit of FIG. 4. The graph of FIG. 5A is an exemplary waveform of the voltage at the control node HO for the high side switch Q1. FIG. 5B is the waveform of the supply voltage. FIG. 5C illustrates the sensor voltage of sensor B along with the reference voltage VTHB. FIG. 5D is an illustration of the reference voltage VTHB and the filtered sensor voltage of sensor B. FIG. 5E illustrates the reference voltage VTHS and the voltage of sensor S. FIG. 5F illustrates the over temperature alarm signal provided at terminal 10. FIG. 5G illustrates a reference temperature THB for the sensor B and the temperature sensed by sensor B. FIG. 5H illustrates the temperature of sensor S. The sensor voltage is affected by unidirectional switching noise which causes a DC offset indicated by the solid line of FIG. 5D. This offset may be added to the sensor voltage and results in errors in detecting over temperature. In FIGS. 5A-H, the left dotted line indicates the beginning of the rise of temperature. The center dotted line indicates a false detector alarm signal and the right dotted line indicates the time when the alarm signal should have been triggered. Thus, the conventional circuit of FIG. 4 clearly allows for false alarm signals.

Figure 6:
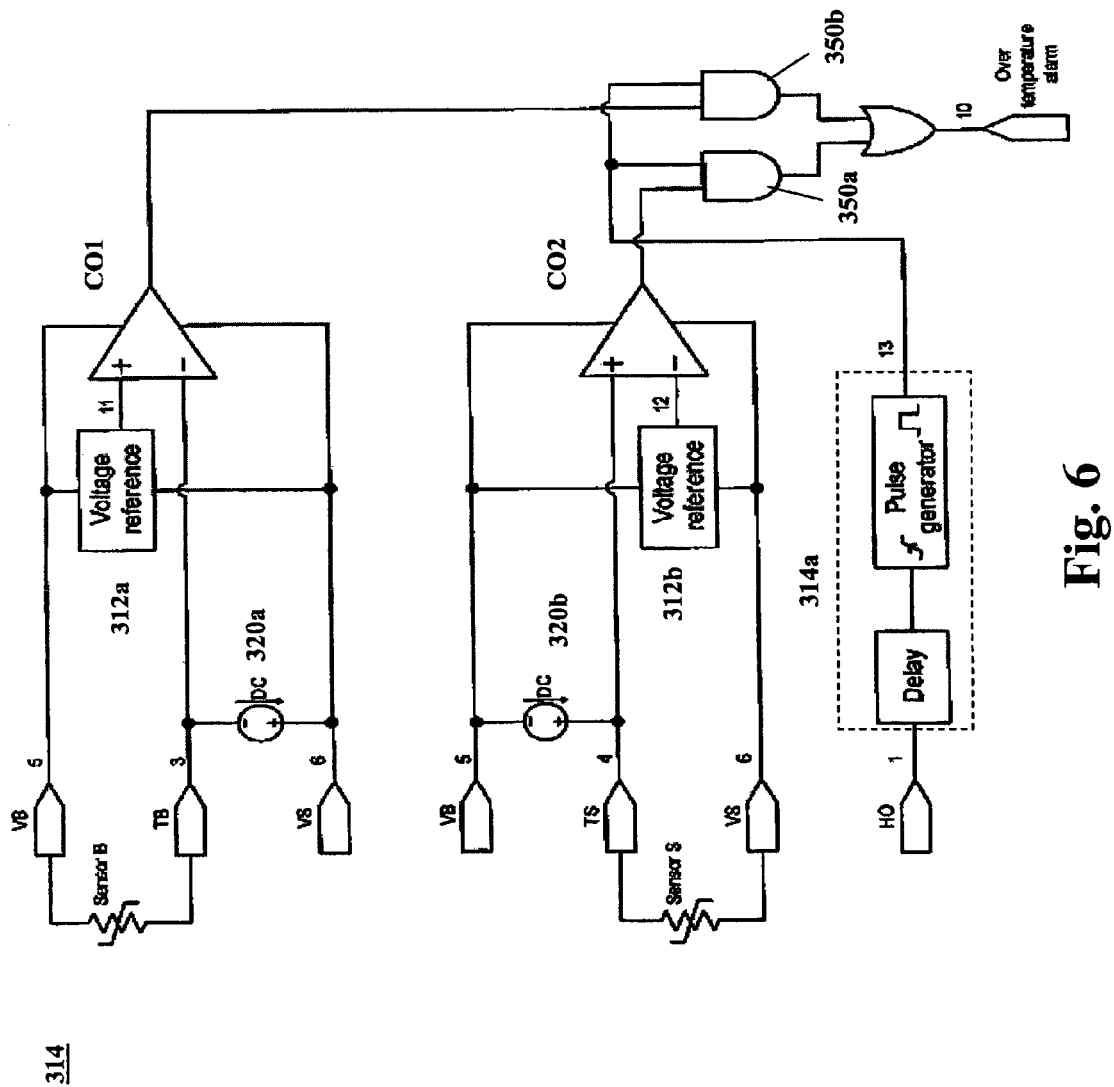
FIG. 6 illustrates a temperature detector circuit in accordance with an embodiment of the present application.

FIG. 6 illustrates a novel over temperature detector circuit 314 in accordance with an embodiment of the present application. The detector circuit 314 is connected to dual sensors B, S. That is, a single circuit 314 detects an over temperature condition for two switches Q1, Q2. Power supply terminals VB and VS are provide along with sensor terminals TB and TS. For each temperature sensor B, S, a current source 320a, 320b, a voltage reference 312a, 312b and an analog comparator CO1, CO2 are provided. The comparator outputs are gated with the silent gate signal from the generator 314a via AND gates 350a, 350b. The generator 314a includes a delay element 360 and a pulse generator 362 with an input connected to the power switch, or the control terminal thereof HO. The current sources 320a, 320b drive current from node TB to node VS and node VB to node TS, respectively. The voltage reference circuits 312a, 312b generate threshold voltages VTHB and VTHS which are referenced to VB and VS respectively.

The output of the generator 314a is active during a narrow time window and is triggered by the delayed positive flank of the power switch control signal HO. The delay is sufficiently long to allow switching noise to fade and avoid false alarms. The time window ends before the next switching action, by either switch such that the signal is high when a low noise condition is present. The generator 114a illustrated in FIG. 2 and described above, may be implemented in the same manner as generator 314a. FIG. 7 illustrates exemplary timing diagrams for the circuit of FIG. 6.

Figure 7A:
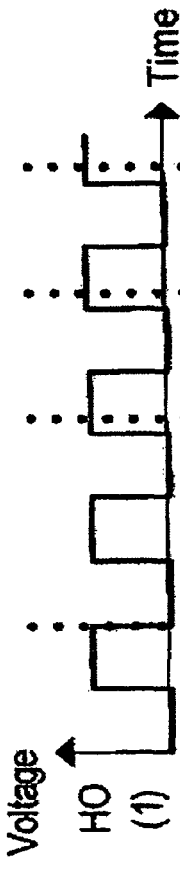
FIG. 7A-7H are graphs illustrating exemplary waveforms of the detector circuit of FIG. 6.
Figure 7B:
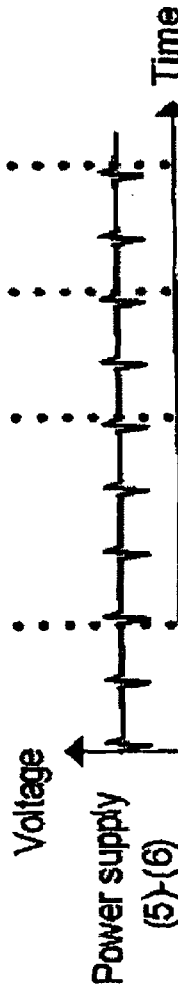
Figure 7C:
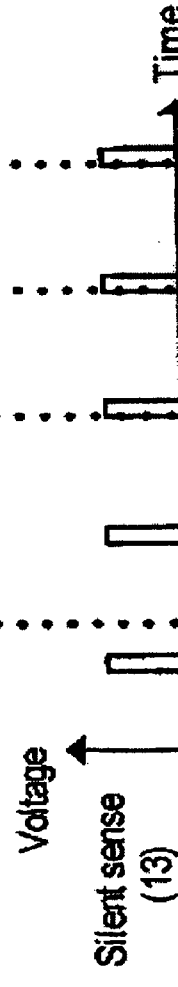
Figure 7D:
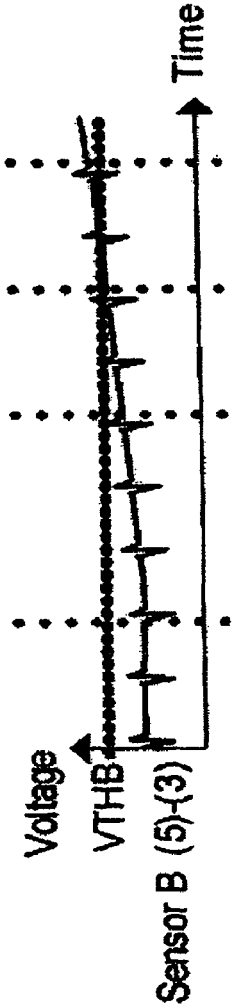
Figure 7E:
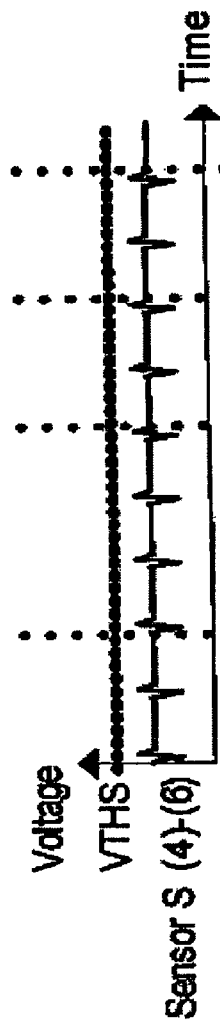
Figure 7F:
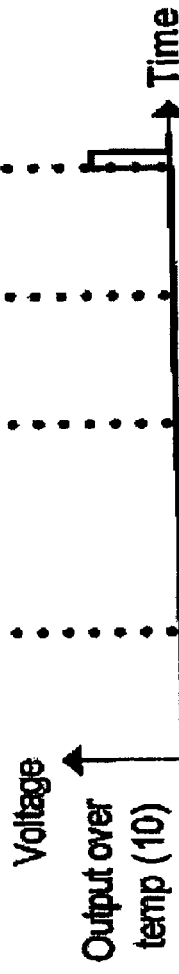
Figure 7G:
Figure 7H:
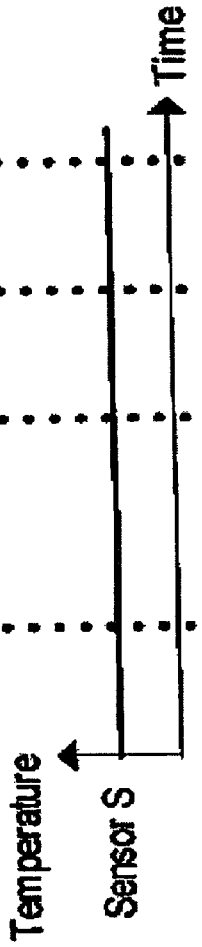

FIG. 7A illustrates the waveform of the control signal HO. FIG. 7B is the supply voltage. FIG. 7C illustrates the time window signal of the generator. FIG. 7D illustrates the sensor output signal of sensor B and reference voltage VTHB and FIG. 7E illustrates sensor output signal of sensor S and reference voltage VTHS. FIG. 7F illustrates the output signal of the detector circuit, that is, the alarm signal provided at terminal 10. FIG. 7G illustrates the temperature detected by sensor B and FIG. 7H illustrates the temperature detected by sensor S.

In general, the switching activity represented in the waveform HO generates switching noise at the supply voltage and at the temperature sensor B. The temperature starts off low, but the temperature at sensor B increases gradually. When the sensor voltage approaches threshold VTHB, switching noise causes the sensor voltage to cross the threshold VTHB, in a manner similar to that described above. The output of comparator CO1, however, is gated until the next generator 114a output window, so that it is prevented from triggering the alarm. The over temperature alarm is only triggered, that is, driven high, when the comparator output and the output of the generator 1114a are both high. That is, when the sensor temperature exceeds the threshold VTHS and the noise level is low. This eliminates false alarms that are triggered by noise. In FIG. 7, the left dotted line indicates the beginning of temperature rise. The second dotted line indicates a time when the noise signal drives the sensor signal over the threshold, but proper gating prevents a false alarm. The right line indicates a time when the generator window (output signal is high) and the over temperature alarm is triggered.

Figure 8:
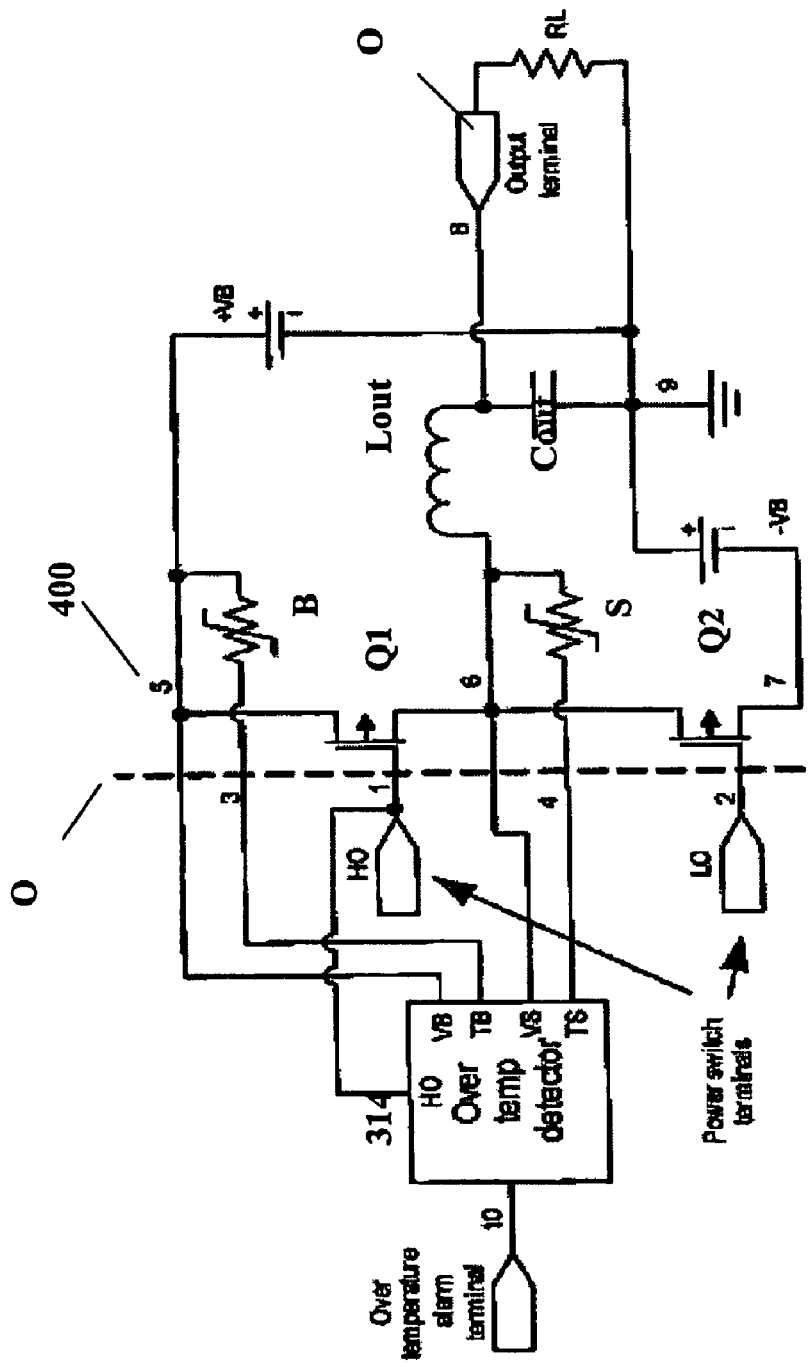
FIG. 8 illustrates the temperature detector circuit of FIG. 6 being used with an exemplary power switching converter in accordance with an embodiment of the present application.

FIG. 8 illustrates the over temperature detector circuit 314 connected to a switching power converter 400 including switches Q1, Q2 and temperature sensors B and S monitoring the temperature of those switches. The terminals HO, LO control the switches Q1, Q2. An output inductor Lout and capacitor Cout are connected to the node between the switches Q1, Q2. Two power supplies provide the positive and negative rails +VB and −VB. The resistance is represented by the resistor RL. Components on the left side of the dotted line A are integrated circuits while those on the right side are preferably PCB level circuits. The sensors B, S are connected between the supply voltage and the sensor terminals of the circuit 314. A power switch input HO is provided connected to the control terminal of the high side switch Q1 to provide an indication of noise triggering events for the detector circuit. This information is used by the generator 314a to provide proper gating to avoid false alarms as is described above.

Thus, the detector circuit of the present application provides accurate detection of an over temperature condition even when the sensors are connected directly to the electrodes of the switches and are distorted by switching noise. Properly gating the sensor input signals, and/or, the output alarm signal to prevent inadvertent triggering of the over temperature alarm signal during times of high noise improves reliability of the over temperature detecting circuit.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. An over temperature detector circuit for use in a switching converter including one or more power switches comprises:
   a silent sense generator connected to at least one power switch and operable to detect a noise level of the switch and to provide a generator output signal indicative of absence of switching noise; and
   a comparator operable to compare a temperature sensor signal from a temperature sensor with a reference voltage to provide an alarm signal indicating an over temperature condition when the temperature sensor signal exceeds the reference voltage, wherein the alarm signal does not indicate an over temperature condition when the generator output signal does not indicate absence of switching noise.

2. The over temperature detector of claim 1, wherein the generator output signal is high when the noise level of the switch is low.

3. The over temperature detector circuit of claim 1, further comprising an AND gate connected to an output of the comparator and to an output of the silent sense generator to provide the alarm signal such that the over temperature condition is indicated when the output of the AND gate is high.

4. The over temperature detector circuit of claim 3, wherein the silent sense generator further comprises:
   a delay unit connected to a control terminal of the at least one power switch and operable to delay the control signal of the power switch a predetermined amount; and
   a pulse generator receiving the delayed control signal from the delay signal to provide the generator output signal such that the generator output signal is high when the noise level of the power switch is low.

5. The over temperature detector circuit of claim 4, wherein the silent sense generator, comparator and AND gate are embodied in an integrated circuit.

6. The over temperature detector circuit of claim 5, wherein the temperature sensor and the power switch are printed circuit board components.

7. The over temperature detector circuit of claim 1, further comprising a gate unit connected to an output of the temperature sensor and to an output of the silent sense generator and operable to provide the temperature sensor signal as a gate output signal to the comparator only when the generator output signal indicates absence of switching noise.

8. A switching power converter with over temperature detection comprises:
   a first power switch;
   a second power switch connected in series with the first power switch such that a desired voltage is provided at an output node between the first and second power switches;
   a first temperature sensor connected to the first switch;
   a second temperature sensor connected to the second switch; and
   an over temperature detector circuit connected to the first temperature sensor, the second temperature sensor and a control terminal of at least one of the first and second power switches, the over temperature detector circuit operable to provide an over temperature alarm signal indicating an over temperature condition when a temperature of the first power switch or the second power switch exceeds predetermined threshold values, wherein the alarm signal does not indicate an over temperature condition when a noise level on one of the first and second power switches is high.

9. The switching power converter of claim 8, wherein the over temperature detector circuit further comprises:
   a silent sense generator connected to the control terminal of one of the first and second power switches and operable to detect a noise level of the switch and to provide a generator output signal indicative of the noise level of the switch;
   a first comparator operable to compare a first temperature sensor signal from the first temperature sensor with a first reference voltage to provide a first comparator output;

a second comparator operable to compare a second temperature sensor signal from the second temperature sensor with a second reference voltage to provide a second comparator output;

a first AND gate receiving the first comparator signal and the generator output signal as inputs;

a second AND gate receiving the second comparator signal and the generator output signal as inputs; and an OR gate receiving outputs of the first AND gate and the second AND gate to provide the alarm signal, such that the alarm signal indicates an over temperature condition when the alarm signal is high.

10. The switching power converter of claim 8, wherein the over temperature detector circuit further comprises:

a silent sense generator connected to the control terminal of one of the first and second power switches and operable to detect a noise level of the switch and to provide a generator output signal indicative of the noise level of the switch;

a first gate unit receiving an output of the first temperature sensor and the generator output signal as inputs;

a second gate unit receiving an output of the second temperature sensor and the generator output signal as inputs, wherein the first gate unit provides the output of the first temperature sensor as a first gate output signal and the second gate unit provides the output of the second temperature sensor as a second gate output only when the generator output signal indicates a low noise level;

a first comparator operable to compare the first gate output with a first reference voltage to provide a first comparator output;

a second comparator operable to provide the second gate output signal with a second reference voltage to provide a second comparator output; and an OR gate receiving first and second comparator output signals to provide the alarm signal, such that the alarm signal indicates an over temperature condition when the alarm signal is high.

11. The switching power converter of claim 8, wherein the generator output signal is high when the noise level is low.

12. The switching power converter of claim 11, wherein the silent sense generator further comprises:

a delay unit connected to the control terminal of at least one of the first and second power switches and operable to delay the control signal of the power switch a predetermined amount; and a pulse generator receiving the delayed control signal from the delay unit to provide the generator output signal such that the generator output signal is high when the noise level of the power switch is low.

13. The switching power converter of claim 12, wherein the over voltage detector circuit is an integrated circuit.

14. The switching power converter of claim 13, wherein the first and second power switches and first and second temperature sensors are printed circuit board components.

15. An over temperature detector circuit for use in a switching converter including one or more power switches comprises:

a silent signal generator connected to at least one power switch and operable to detect a noise level of the switch and to provide a generator output signal indicative of absence of switching noise; and a comparator operable to compare a temperature sensor signal from a temperature sensor connected to the power switch with a reference voltage to provide an alarm signal indicating an over temperature condition when the temperature sensor signal exceeds the reference voltage, wherein the alarm signal does not indicate an over temperature condition when the generator output signal does not indicate absence of switching noise.

* * * * *